(12) United States Patent
Onda

(10) Patent No.: US 6,194,747 B1
(45) Date of Patent: *Feb. 27, 2001

(54) FIELD EFFECT TRANSISTOR

(75) Inventor: Kazuhiko Onda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/162,355

(22) Filed: Sep. 29, 1998

(30) Foreign Application Priority Data

Sep. 29, 1997 (JP) .................................... 9-264343

(51) Int. Cl.$^7$ .................. H01L 31/0328; H01L 31/0336
(52) U.S. Cl. ............................................ 257/192; 257/194
(58) Field of Search ................................... 257/192, 194

(56) References Cited

FOREIGN PATENT DOCUMENTS

| 6-120258 | 4/1994 | (JP) | 257/192 |
|---|---|---|---|
| 8-55979 | 2/1996 | (JP) | 257/192 |
| 8-172182 | 7/1996 | (JP) | 257/192 |
| 8-222578 | 8/1996 | (JP) | 257/192 |
| 9-45894 | 2/1997 | (JP) | 257/192 |
| 9-64340 | 3/1997 | (JP) | 257/192 |

OTHER PUBLICATIONS

K.H.G. Duh et al., "A Super Low–Noise 0.1 $\mu$m T–Gate InAlAs–InGaAs–InP HEMT", *IEEE Microwave and Guided Wave Letters*, vol. 1, No. 5, May 1991, pp. 114–116.

G.I. Ng et al., "Improved Strained HEMT Characteristics Using Double–Heterojunction In0.65Ga0.35As/In0.52Al0.48As Design", *IEEE Electron Device Letters*, vol. 10, No. 3, Mar. 1989, pp. 114–116.

K. Onda et al., "Highly Reliable InAlAs/InGaAs Heterojunction FETs Fabricated Using Completely Molybdenum–Based Electrode Technology (COMET)", *1994 IEEE MTT S Digest*, 1994, pp. 261–264.

T. Akazaki et al., "Improved InAlAs/InGaAs HEMT Characteristics by Inserting an InAs layer into the InGaAs Channel", *IEEE Electron Device Letters*, vol. 13, No. 6, Jun. 1992, pp. 325–327.

*Primary Examiner*—Steven H. Loke
(74) *Attorney, Agent, or Firm*—Sughrue, Mion, Zinn, Macpeak & Seas, PLLC

(57) ABSTRACT

There is disclosed a field effect transistor having a two-stage recess structure formed upon an InP substrate and showing stable device characteristics and a low contact resistance. The FET is manufactured as follows. Upon an InP substrate 101, a channel layer 103, electron supply layers 104 and 105, an undoped InAlAs Schottky layer 106, an n-type InAlAs first cap layer 107 and an n-type InGaAs second cap layer 108 are formed in succession, following which a second recess opening 111 is formed by etching from the surface of the second cap layer to just the surface of said Schottky layer or further to a level to remove a part of the Schottky layer. A first recess opening 110 is formed by side-etching the second cap layer using an etchant of which etching selectively of InGaAs over InAlAs is 30 or more.

3 Claims, 13 Drawing Sheets

FIELD EFFECT TRANSISTOR

BACKGROUND OF THE INVENTION

1. Field of the Invention

The present invention relates to a field effect transistor (FET) that operates in microwave and millimeter-wave region and more particularly to an FET having a two-stage recess structure.

2. Description of the Prior Art

Recently, tertiary and quaternary mixed crystal semiconductors such as InGaAs and InGaAsP have been drawing much attention. Among them, InGaAs lattice matched to an InP substrate is regarded as an especially promising material for not only optical devices but also various kinds of FETs. As a consequence, FETs utilizing a two-dimensional electron gas (2DEG) formed on heterointerfaces of InGaAs with InP or InAlAs have been particularly widely studied.

The reasons why InGaAs, in comparison with GaAs and the like, is considered highly as an electron transport device are as follows: (1) the peak value in electron drift velocities is high, (2) the electron mobilities at low electric fields are high, (3) it is easy to form ohmic contact electrodes and the contact resistances thereof are low, (4) the electron velocity overshoot is expected to take place, (5) noise owing to the valley scattering is low and (6) characteristics of the insulator-semiconductor interfaces are relatively good. And besides, that the afore-mentioned 2DEG device is realizable is one of the main factors.

At present, an FET utilizing a 2DEG system of the InAlAs/ InGaAs interface is expected as a potential high quality device for microwave and millimeter-wave application and has been investigated in various aspects. In particular, as a low noise element, effectiveness thereof has been confirmed by experiments. For example, at 94 GHz, noise figure of 1.2 dB and incidental gain of 7.2 dB at room temperature were reported by K. H. Duh et al. in IEEE Microwave and Guided Wave Letters, Vol.1, No.5, P.114–116, 1991. These results were obtained in a device fabricated from a material system lattice matched to an InP substrate. That is, the composition of In in the material system was set as $In_{0.52} Al_{0.45} As/In_{0.53} Ga_{0.47} As$. In this system, a 2DEG is formed in the $In_{0.53} Ga_{0.47} As$ layer. In order to improve the device characteristics further, various attempts including the use of different In composition in an InGaAs channel layer, for example, setting higher than 0.53, as reported by G. I. Ng et al. in IEEE Electron Device Letters, Vol.10, No.3, P.114–116, 1989, have been made.

In such an InAlAs/InGaAs heterojunction FET, InGaAs is, in general, widely utilized as a 2DEG channel, of which the band gap is around 0.75 eV and smaller than that of GaAs and hence the rate of impact ionization is higher. Therefore, the breakdown voltage for a device is small in comparison with that for a GaAs heterojunction FET. For a stable device performance, the device is required to have a higher breakdown voltage and, in order to achieve this, several approaches have been made; on the one hand, new designs for the epilayer of the device, and on the other hand, the optimization of geometry around the gate, for example, through an expansion of the gate recess, have been being investigated.

Further, in the case that a high density cap layer is used, by setting the recess edge of this cap layer as far from the gate electrode as possible, an electric field generated by the applied voltage through the gate can be alleviated, which results in the lowered rate of impact ionization of channel electrons. This also contributes the reduction of the parasitic capacitance between the gate and the cap layer, leading to an increase in the power gain of the device. On the side of the source electrode, however, this causes an increase in the source resistance and therefore is counterbalanced by the degradation of characteristics.

Generally, InAlAs semiconductors have a problem of surface instability, resulting from surface oxidation and the like. On the recess surface around the gate, electron traps to capture electrons sometimes develop, depending on the semiconductor material. In afore-mentioned InAlAs/InGaAs heterojunction FETs, InAlAs is often utilized as a Schottky layer of gate electrode, but, this InAlAs lattice matched to an InP substrate contains nearly 50% of Al so that the surface trap density due to oxidation and the like is high, often causing a problem of surface instability.

A two-stage recess structure is a known method to stop reflecting the surface instability on the device characteristics. This structure is fabricated by etching a cap layer to form a relatively wide recess, and forming, within this first recess, a second recess with a narrower recess width, and then forming a gate within this second recess. The surface of Schottky semiconductor by the side of the gate is, in this structure, placed higher than the position at which the gate electrode is formed. In this manner, even when surface unstability resulting from electron traps on the semiconductor surface and the like exists, the device performance are not affected.

FIG. 14 shows one example of conventional two-stage recess structures. In this structure, upon a semi-insulating InP substrate 201, an undoped InAlAs layer 202 as a buffer layer, an undoped InGaAs layer 203 as a channel layer, an undoped InAlAs layer 204 and an n-type doped InAlAs layer 205 as electron supply layers which supply carriers to the channel layer (an undoped InAlAs layer 204 may be regarded as a spacer layer), an undoped InAlAs layer 206 as a Schottky layer, and an n-type doped InGaAs layer 207 as a cap layer to have electrical contacts with electrodes, are grown in succession, and further, a first recess 209 is set through the cap layer (the n-type doped InGaAs layer 207) and then a second recess 210 is set within this first recess by removing a part of Schottky layer. On the exposed surface of the Schottky layer at the bottom of this second recess opening, a gate electrode 208a is formed and on the cap layer (the n-type doped InGaAs layer 207) a source electrode and a drain electrode are formed.

In such a conventional structure, if the source electrode and the drain electrode are made of metal materials and form non-alloy ohmic contacts without metal materials being alloyed with semiconductor layers, a discontinuity of the conduction-bands between InGaAs which is normally used for a cap layer and InAlAs which is normally used for a Schottky layer is large, thus causing a problem of high contact resistance.

As for the conventional FET which is fabricated upon a GaAs substrate, alloy-type ohmic electrodes, for which AuGe and Ni are used to form a source electrode and a drain electrode and then alloyed, are widely utilized in order to lower the contact resistance.

Yet, when alloy-type ohmic electrodes of AuGe and Ni are applied to a heterojunction FET fabricated upon an InP substrate, as pointed out by K. Onda et al. in MTT Symposium Proceedings, P. 261–264, 1994, for example, in acceleration tests carried out at around 300° C., alloying progresses further and the resistance increases. Therefore, a problem of unreliability may arise in actual practical situations.

Meanwhile, in IEEE Electron Device Letters, Vol.13, P.325, 1992, it is demonstrated that, in a heterojunction FET having a single recess structure, non-alloy ohmic contacts can be formed by growing, upon an undoped InAlAs Schottky layer, cap layers which consist of an n-type InAlAs layer and an n-type InGaAs layer, overlying in succession. Nevertheless, in a two-stage recess structure using an InP substrate, non-alloy ohmic contact has not been known yet.

Further, with respect to this epi-structure, when the usual manufacturing method is applied to the two-stage recess structure, a first recess is formed through to an undoped InAlAs Schottky layer, and a second recess, with a narrower width than the first, is formed within the first recess, and then a gate electrode is formed within the second recess. But, in this structure, at the time of a first recess formation, two overlying cap layers of InGaAs and InAlAs are to be simultaneously removed, and thereby causes a problem that a sheet resistance right under the first recess may increase. Further, an undoped InAlAs Schottky layer is exposed at the bottom of the first recess so that the potential profile changes gradually from this exposed surface to the interior, which leads to another problem that the influence of the surface tends to appear on the device operation.

Further, as a method of manufacturing of a two-stage recess-type FET, it was a general practice that, a first recess with a wide opening is formed at the first stage by etching, and then a second recess with a narrower opening than the first is formed within the first recess by another etching. In this method, however, steps of exposure using photoresist, developing and etching are each required twice, which makes steps of manufacturing process rather complicated.

SUMMARY OF THE INVENTION

In light of the above problems, an object of the present invention is to provide an FET, having a two-stage recess structure formed upon an InP substrate and showing stable device characteristics, and particularly a stable FET with a low contact resistance.

A further object of the present invention is to provide a method of manufacturing such a high performance two-stage recess-type FET under good control.

The present invention is directed to an FET, comprising, upon an InP substrate;
a channel layer formed from an undoped semiconductor,
an electron supply layer in which n-type impurities are doped partially or all along the direction of the thickness, for supplying carriers to said channel layer,
an undoped InAlAs Schottky layer,
an n-type InAlAs first cap layer set in contact with said Schottky layer,
an n-type InGaAs second cap layer set in contact with said first cap layer,
a first recess opening bored through said second cap layer,
a second recess opening which is bored, within the first recess opening, through said first cap layer till just the surface of said Schottky layer is reached, or the interior of said Schottky layer by removing a part thereof,
a gate electrode formed on the exposed surface of said Schottky layer at the bottom of the second recess opening, and
a source electrode and a drain electrode which are formed upon said second cap layer on each side of said first recess opening.

This FET may be manufactured by a method comprising steps of:
forming a channel layer of an undoped semiconductor upon an InP substrate,
forming an electron supply layer in which n-type impurities are doped partially or all along the direction of the thickness for supplying carriers to said channel layer,
forming an undoped InAlAs Schottky layer,
forming an n-type InAlAs first cap layer over the entire surface of said Schottky layer,
forming an n-type InGaAs second cap layer over the entire surface of said first cap layer,
forming a second recess opening into a prescribed shape by etching from the surface of the second cap layer through the second and the first cap layers to just the surface of said Schottky layer or further to a level to remove a part of said Schottky layer, and
forming, in succession, a first recess opening into a prescribed shape by side-etching the second cap layer using an etchant of which the etching selectivity of InGaAs over InAlAs is 30 or more.

A similar method can be applied to manufacturing an FET in conventional structure. Namely, this manufacturing method comprises the steps of:
forming a channel layer from an undoped semiconductor upon an InP substrate,
forming an electron supply layer in which n-type impurities are doped partially or all along the direction of the thickness for supplying carriers to said channel layer,
forming an undoped InAlAs Schottky layer,
forming an n-type InGaAs cap layer over the entire surface of said Schottky layer,
forming a second recess opening into a prescribed shape by etching from the surface of said n-type InGaAs cap layer through said n-type InGaAs cap layer to a level to remove a part of Schottky layer, and
forming, in succession, a first recess opening into a prescribed shape, by side-etching said n-type InGaAs cap layer, using an etchant of which etching selectivity of InGaAs over InAlAs is 30 or more.

In the present invention, because the use of the n-type InAlAs first cap layer reduces the resistances between the n-type InGaAs second cap layer and the undoped InAlAs Schottky layer, low contact resistance is obtained even using non-alloy ohmic electrodes.

Further, the bottom of the first recess is on the n-type InAlAs first cap layer. The profile of the second recess shows a steep angle in the n-type InAlAs first cap layer, and becomes almost horizontal in the undoped InAlAs Schottky layer. That is to say, the interior of the device is not easily affected by the condition of the surface, and, therefore, the device of particularly stable performance is easily obtained.

In the FET, according to the present invention, gate recess is in the form of two stages and the gate-semiconductor contact is placed in the sections etched deeper than the semiconductor surface neighboring the gate side so that variations in device characteristics owing to unstability of the semiconductor surface is well suppressed.

Further, in the manufacturing method according to the present invention, the n-type InGaAs second cap layer which is the outermost surface layer is etched selectively after the gate contact face is exposed, and, hence, the first recess opening can be formed with excellent controllability. At the same time, manufacturing steps are simplified and the manufacturing cost is reduced.

In addition, a similar manufacturing method to this can be applied to the conventional device structure in which an n-type InAlAs layer is not utilized as a layer of the cap layers right under the InGaAs outermost surface layer.

IN FIGS. NUMERALS INDICATE AS FOLLOWS

Figure 1:
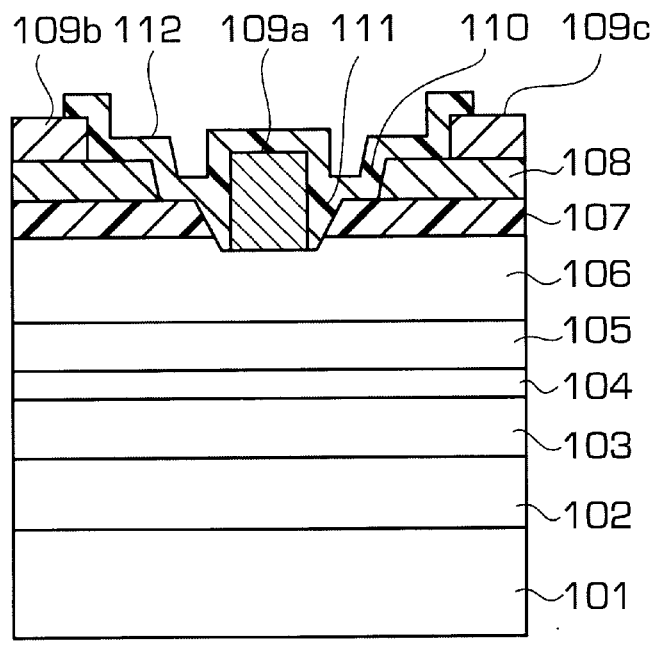
FIG. 1 is a cross-sectional view showing the main part of a field effect transistor in accordance with one embodiment of the present invention.

101 . . . Semi-insulating InP substrate
102 . . . Undoped InAlAs layer (Buffer layer)
103 . . . Undoped InGaAs layer (Channel layer)
104 . . . Undoped InAlAs layer (A part of electron supply layers)
105 . . . N-type InAlAs layer (A part of electron supply layers)
106 . . . Undoped InAlAs layer (Schottky layer)
107 . . . N-type InAlAs layer (First cap layer)
108 . . . N-type InGaAs layer (Second cap layer)
109a . . . Gate electrode
109b . . . Source electrode
109c . . . Drain electrode
110 . . . First recess
111 . . . Second recess
112 . . . SiN passivation film
121 . . . Photoresist
122 . . . Photoresist
123 . . . Gate metal
125 . . . Ohmic metal
127 . . . Photoresist
201 . . . Semi-insulating InP substrate
202 . . . Undoped InAlAs layer (Buffer layer)
203 . . . Undoped InGaAs layer (Channel layer)
204 . . . Undoped InAlAs layer (A part of electron supply layers)
205 . . . N-type InAlAs layer (A part of electron supply layers)
206 . . . Undoped InAlAs layer (Schottly layer)
207 . . . N-type InGaAs layer (Cap layer)
208a . . . Gate electrode
208b . . . Source electrode
208c . . . Drain electrode
209 . . . First recess
210 . . . Second recess
211 . . . SiN passivation film
221 . . . Photoresist
222 . . . Photoresist
223 . . . Gate metal
225 . . . Ohmic metal
227 . . . Photoresist

DETAILED DESCRIPTION OF THE INVENTION

Referring to the drawings, the embodiments of the present invention are described in detail.

First Embodiment

FIG. 1 is a cross-sectional view showing the main part of one example of FETs in accordance with the present invention.

The epistructure of this FET, upon a semi-insulating InP substrate 101, comprises a 500 nm-thick undoped InAlAs layer 102 as a buffer layer, a 20 nm-thick undoped InGaAs layer 103 as a channel layer, a 5 nm-thick undoped InAlAs layer 104 and a 15 nm-thick Si-doped InAlAs layer 105 with a doping density of $3 \times 10^{18}$ cm$^{-3}$ as electron supply layers (the undoped InAlAs layer 104 can be regarded as a spacer layer), a 20 nm-thick undoped InAlAs layer 106 as a Schottky layer, a 20 nm-thick Si-doped InAlAs layer 107 with a doping density of $3 \times 10^{18}$ cm$^{-3}$ as a first cap layer, and a 20 nm-thick Si-doped InGaAs layer 108 with a doping density of $3 \times 10^{18}$ cm$^{-3}$ as a second cap layer, overlying succesively in this order.

Ohmic electrodes 109b and 109c are formed as layered structures of Ti/Pt/Au upon the uppermost InGaAs second cap layer and are not annealed. Between the ohmic electrodes 109b and 109c, a first recess 110 is formed. The depth of this first recess reaches to the surface of the undoped InAlAs first cap layer 107 and the width thereof is 2 μm.

Within this first recess 110, a second recess 111 is, further, formed. The depth of the second recess reaches to the interior of the undoped InAlAs Schottky layer 106 and the width thereof is 1.1 μm.

Within this second recess, a gate electrode 109a is formed, with Ti/Pt/Au overlying in this order and the length thereof is 1 μm. Further, the surface of device is covered with a SiN film 112 which is deposited by the plasma CVD method.

As for the initial characteristics of this FET, the transconductance is as high as 600 mS/mm, the Schottky barrier height is 0.5 eV and the gate inverse breakdown voltage is 11 V.

Next, referring to FIGS. 2–13, a method of manufacturing the FET shown in this embodiment is described.

Figure 2:
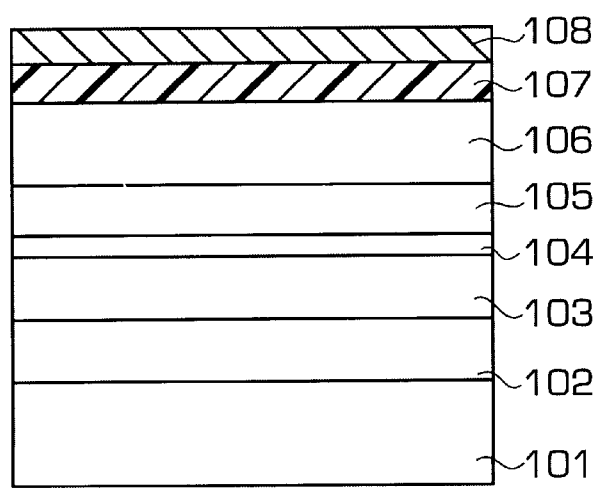
FIGS. 2 to 13 illustrate steps in mananufacturing method of an FET according to the present invention in sequence.

(a) As shown in FIG. 2, using the molecule beam epitaxial (MBE) growth method, upon a semi-insulating InP substrate 101, a 500 nm-thick undoped InAlAs layer 102 as a buffer layer, a 20 nm-thick undoped InGaAs layer 103 as a channel layer, a 5 nm-thick undoped InAlAs layer 104 and a 15 nm-thick Si-doped InAlAs layer 105 with a doping density of $3\times10^{18}$ cm$^{-3}$ as electron supply layers (the undoped InAlAs layer 104 can be regarded as a spacer layer), a 20 nm-thick undoped InAlAs layer 106 as a Schottky layer, a 20 nm-thick Si-doped InAlAs layer 107 with a doping density of $3\times10^{18}$ cm$^{-3}$ as a first cap layer, and a 20 nm-thick Si-doped InGaAs layer 108 with a doping density of $3\times10^{18}$ cm$^{-3}$ as a second cap layer are grown in this order successively.

Following this, though not shown in the drawings, this epiwafer is coated with a photoresist and patterning of the photoresist is performed to a prescribed mesa-pattern by an exposure and a developing. And then this epiwafer is mesa-etched to have a mesa-form by means of wet etching. The etching is carried out to a halfway level of the undoped InAlAs layer 102 and the etchant used is a solution of phosphoric acid, hydrogen peroxide and water.

Figure 3:
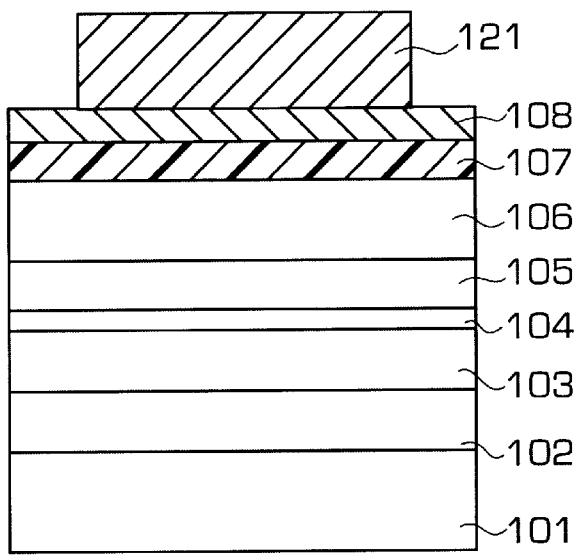

(b) Next, as shown in FIG. 3, a coating of a photoresist 121 is applied to this epiwafer, and by an exposure and a developing, the photoresist 121 is formed to have a pattern with openings at parts where ohmic electrodes are to be formed.

Figure 4:
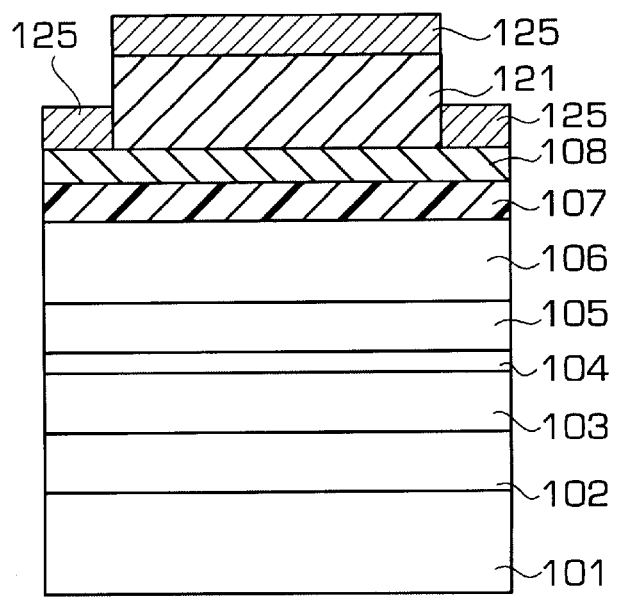

(c) As shown in FIG. 4, Ti, Pt and Au, as ohmic metals 125, are then deposited with a thickness of 50 nm, 50 nm and 200 nm, respectively.

Figure 5:
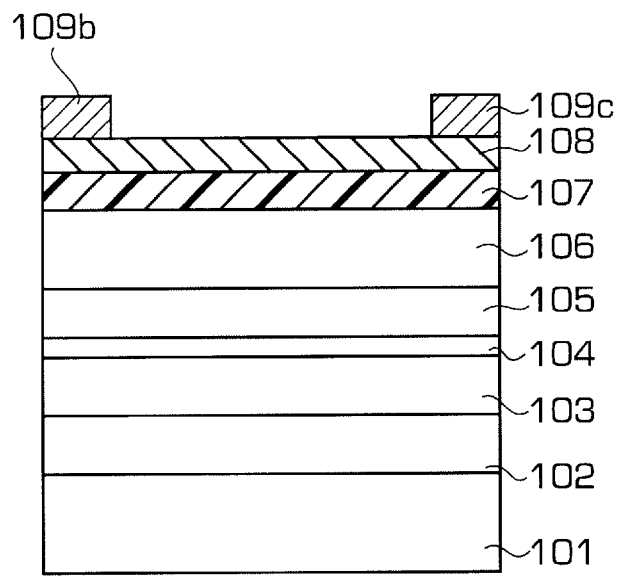

(d) As shown in FIG. 5, lifting off the photoresist leaves layered metal patterns at formation positions for ohmic electrodes, and thereby ohmic electrodes 109b and 109c are fabricated in prescribed forms.

Figure 6:
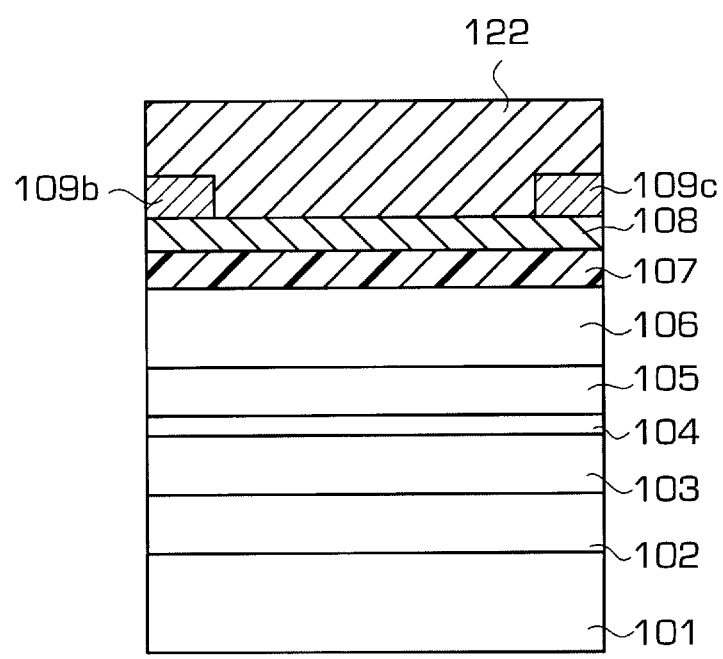

(e) Next, as shown in FIG. 6, after a photoresist 122 is coated over this wafer, an opening which corresponds to a prescribed form of a second recess is patterned by an exposure and a developing (the pattern of the resist is not shown in the drawings). A diameter of the gate opening in this present pattern is 1 $\mu$m and the center of the opening is set almost at the central position between ohmic electrodes.

Figure 7:
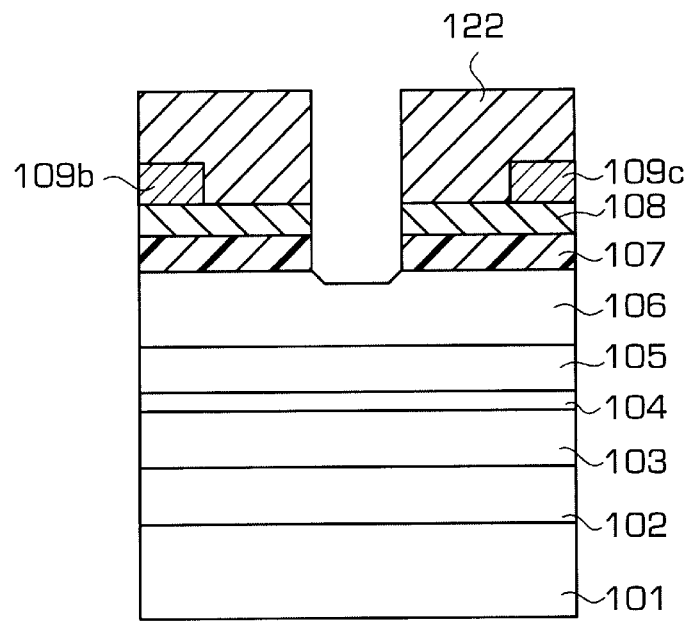

(f) As shown in FIG. 7, using this pattern, a gate recess that is a second recess is formed by wet-etching. In this step, the photoresist is patterned to have not only an opening pattern at the second recess part but also opening patterns over ohmic electrodes so as to be able to monitor the amount of electric current flowing between these ohmic elctrodes. The etchant used in this etching step can etch both of the first cap layer and the second cap layer. For example, a solution of phosphoric acid, hydrogen peroxide and water is used. Wet-etching is performed till a predetermined amount of electric current flows between ohmic electrodes, whereby accomplishing the first recess-etching. In the present design of the device, the depth of the second recess is set to reach the interior of the undoped InAlAs Schottky layer 106. However, etching in this step may be stopped when the bottom of the second recess reaches to the surface of the Schottky layer.

Figure 8:
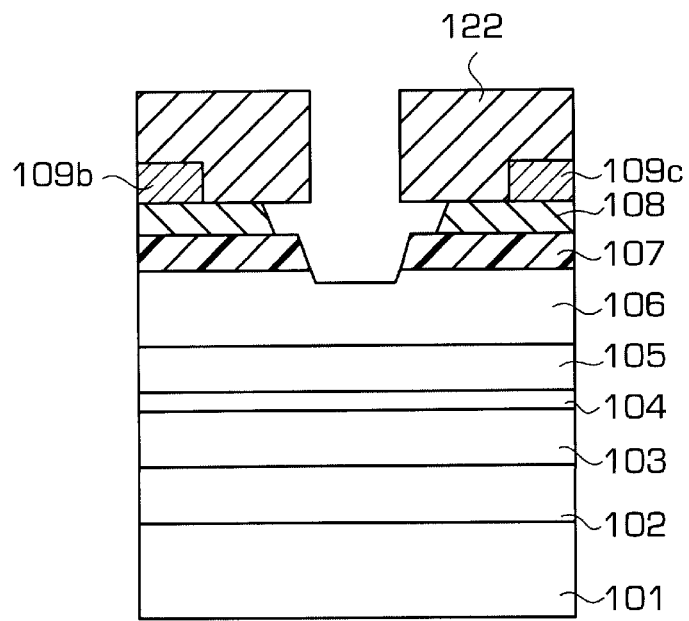

(g) Next, as shown in FIG. 8, using an etchant Which can etch InGaAs selectively, a part of an doped InGaAs second cap layer 108, which is exposed to the sidewall of the opening of the second recess which is formed in a step of (f), is selectively side-etched. An etchant used in this etching is a solution of citric acid, hydrogen peroxide (31%) and water (100 g:100 ml:1000 ml), pH of which is adjusted to 6.0 with the addition of ammonia solution.

The etchant for this etching is not limited to the solution mentioned above, and an etchant which performs selective etching of InGaAs over InAlAs can be used. Generally, the selectivity (etching rate ratio) of InGaAs to InAlAs required for the etchant is 30 or more, preferably 50 or more and more preferably 100 or more.

Etchants which contain a water-soluble organic acid, especially a di- or tricarboxylic acid with 2~10 carbons are preferred. Among them, succinic acid, citric acid, adipic acid and malonic acid are particularly preferred.

Further, etchants contain an oxidant, for which the aforementioned hydrogen peroxide is preferable, since it is relatively stable as a solution and there is no danger in mixing to prepare the etchant.

Further, in the above example, an ammonia solution is used as a pH adjustant but other pH adjustants may be used.

By this step, the width of the first recess is determined and, in this example, the side-etching is carried out till the width of the first recess becomes 2 $\mu$m.

Figure 9:
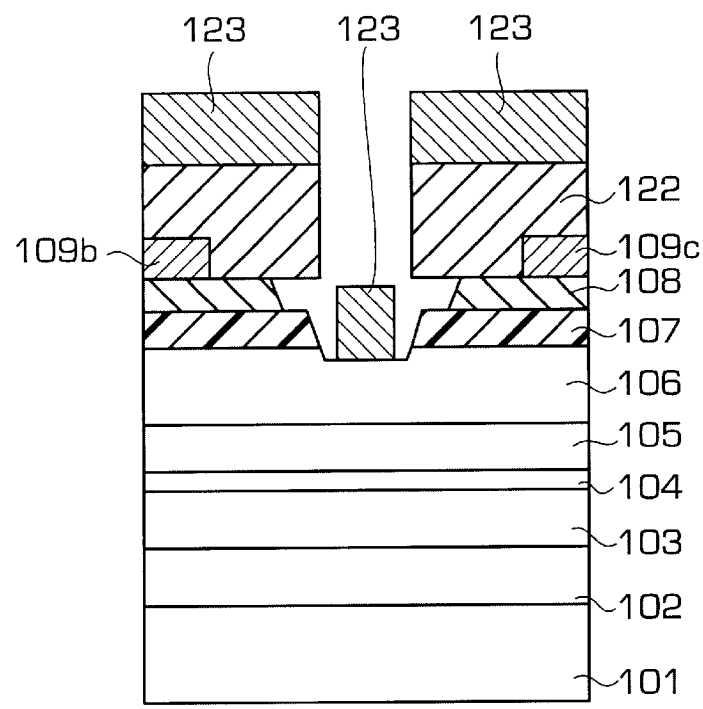

(h) Next, as shown in FIG. 9, gate metal 123 is deposited on the surface of the photoresist 122, resulting in a deposition of a part of gate metal on the base of the second recess through the opening of the photoresist.

Figure 10:
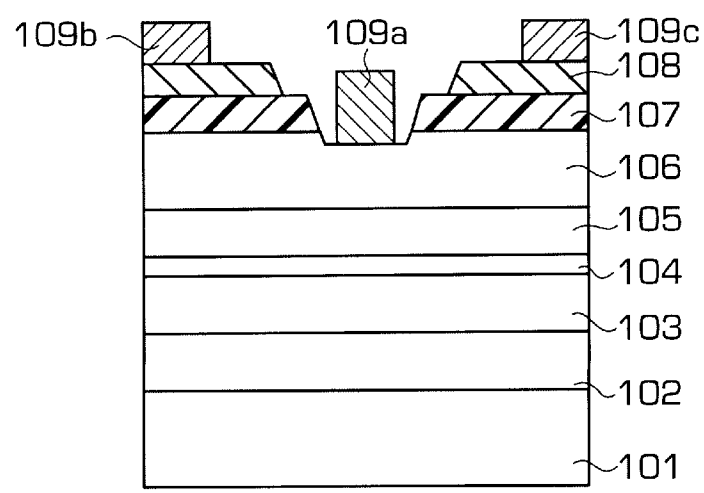

(i) As shown in FIG. 10, the photoresist 122 is lifted off and a gate electrode 109 is formed, wherein Ti, Pt and Au, as gate metals, are deposited with a thickness of 50 nm, 50 nm and 500 nm, respectively.

Figure 11:
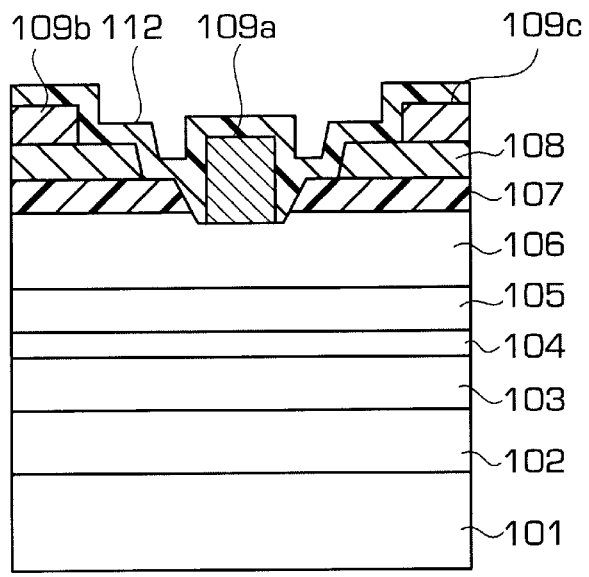

(j) As shown in FIG. 11, after formation of the gate electrode, a passivation film 112, for example, of SiN is grown at 330° C. over the entire surface by plasma chemical vapour deposition (CVD) method.

Figure 12:
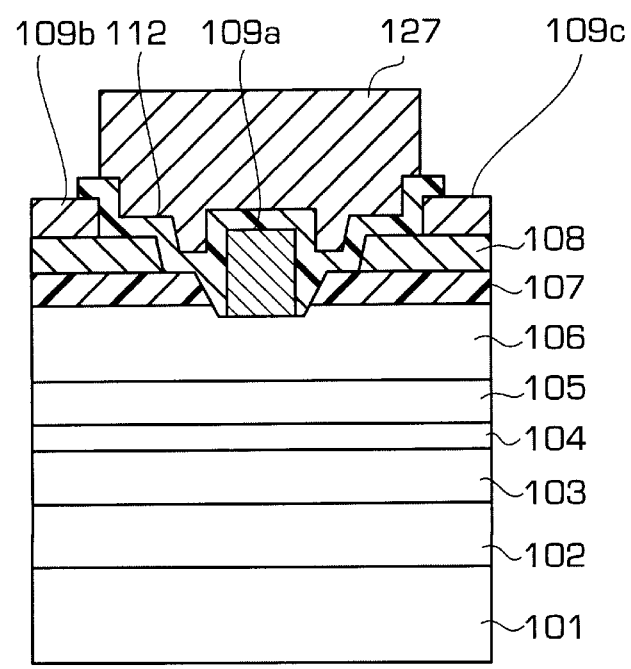

(k) As shown in FIG. 12, by coating another photoresist 127, followed by exposure and developing, photoresist patterns with openings on a part of each electrode are formed. Then, using these patterns as a mask and buffered hydrofluoric acid as an etchant, etching is carried out to remove the parts of the SiN film on each electrode for the external contacts.

Figure 13:
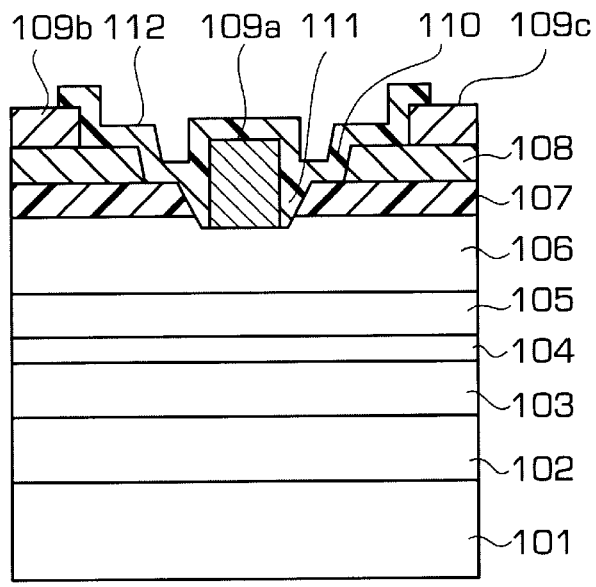

(l) Following this, the photoresist 127 is removed, and thereby an FET as shown in FIG. 13 is completed.

In the FET manufactured in this method, the width of the first recess is formed with excellent controllability and hence no big kink (a phenomenon in which a transition point is observed in I-V characteristics, resulting from surface unstability and the like) is found and, moreover, stable characteristics of the device without optical responses are observed.

Second Embodiment

Figure 14:
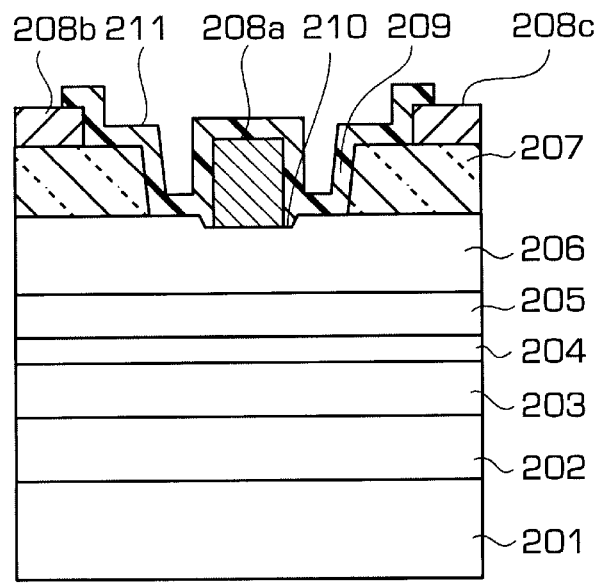
FIG. 14 is a cross-sectional view showing the main part of the conventional FET.

A method of fabricating a two-stage recess structure, using a selective etchng of InGaAs over InAlAs, as described in the first embodiment, can be used not only for a novel structure such as described in the first embodiment but also for a conventional two-stage recesstype FET as shown in FIG. 14. Such a method of manufacturing is described below.

Figure 15:
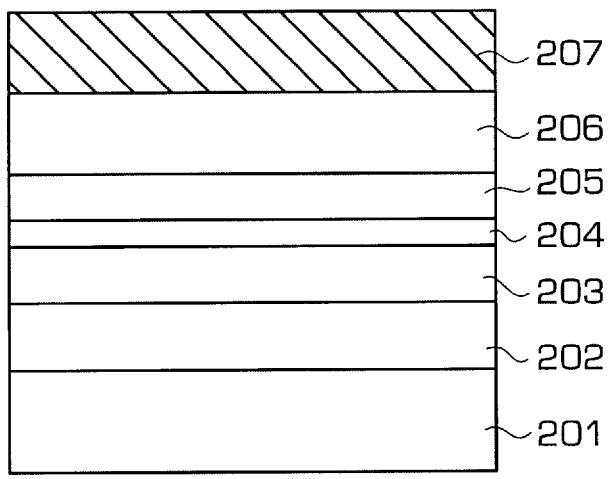
FIGS. 15 to 26 illustrate steps in manufacturing method of an FET according to the present invention in sequence.

(a) As shown in FIG. 15, using the molecular beam epitaxial (MBE) growth method, upon a semi-insulating InP substrate 201, a 500 nm-thick undoped InAlAs layer 202 as a buffer layer, a 20 nm-thick undoped InGaAs layer 203 as a channel layer, a 5 nm-thick undoped InAlAs layer 204 and a 15 nm-thick Si-doped InAlAs layer 205 with a doping density of $3\times10^{18}$ cm$^{-3}$ as electron supply layers, a 20 nm-thick undoped InAlAs layer 206 as a Schottky layer, and a 20 nm-thick Si-doped InGaAs layer 207 with a doping density of $3 \times 10^{18}$ cm$^{-3}$ as a cap layer are grown in this order successively.

Next, though not shown in the drawings, the wafer is formed to have a mesa-shape in the same manner as in the first embodiment.

Figure 16:
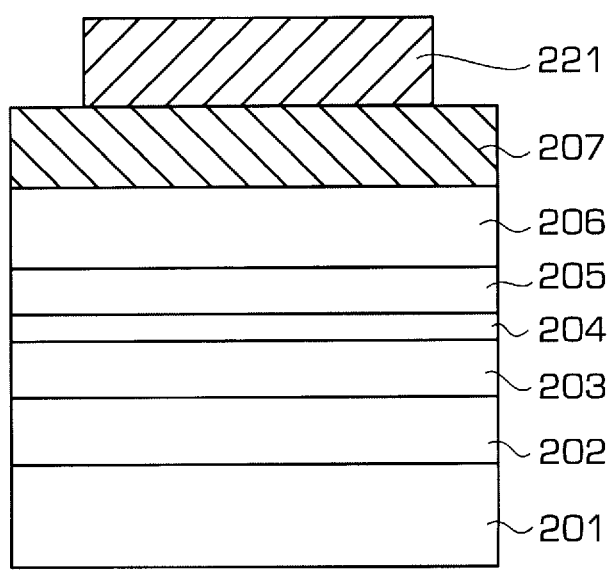

(b) Next, as shown in FIG. 16, a coating of a photoresist 221 is applied to this epiwafer, and by an exposure and a developing, the photoresist 221 is formed to have a pattern with openings at parts where ohmic electrodes are to be formed.

Figure 17:
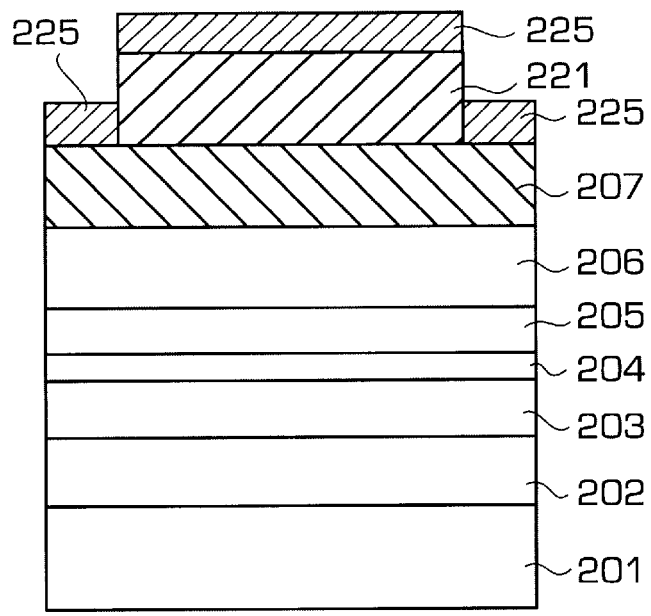

(c) As shown in FIG. 17, Au, Ge and Ni, as ohmic metals 225, are then deposited with a thickness of 100 nm, 50 nm and 50 nm, respectively.

Figure 18:
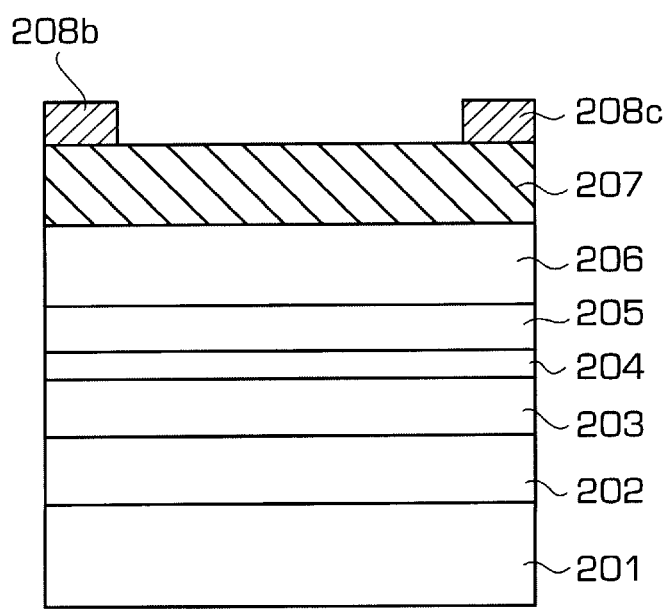

(d) As shown in FIG. 18, lifting off the photoresist leaves layered metal patterns at formation positions for ohmic electrodes. Next, heat treatment is carried out, at, 400° C. in hydrogen atmosphere with ohmic metals of electrodes being alloyed, and thereby a source electrode 208b and a drain electrode 208c are fabricated.

Figure 19:
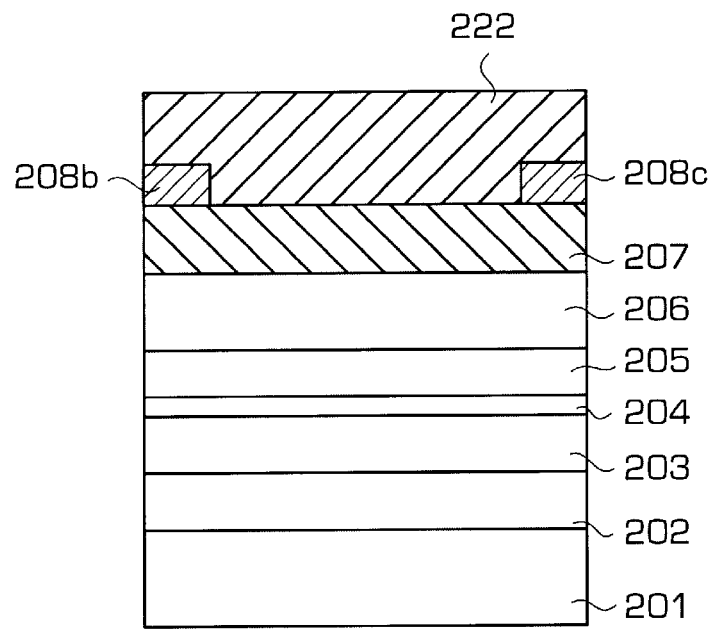

(e) Next, as shown in FIG. 19, after a photoresist 222 is coated over the wafer, an opening which corresponds to a prescribed form of a second recess is patterned by an exposure and a developing (the pattern of the resist is not shown in the drawings). A diameter of the gate opening in this present pattern is 1 $\mu$m and the center of the opening is set almost at the central position between ohmic electrodes.

Figure 20:
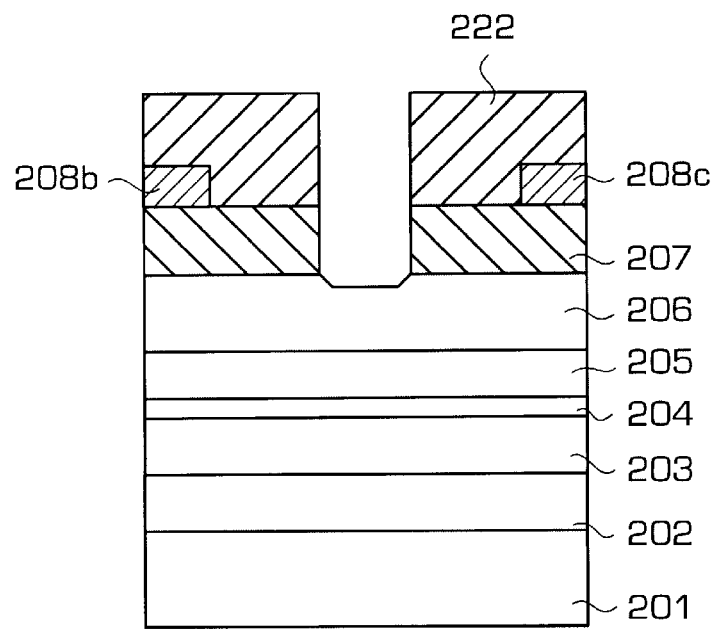

(f) As shown in FIG. 20, using this pattern, a gate recess that is a second recess is formed by wet-etching in the same manner as in the first embodiment. In the present design of the device, the etching is stopped when the depth of the second recess reaches to the interior of the undoped InAlAs Schottky layer 206.

Figure 21:
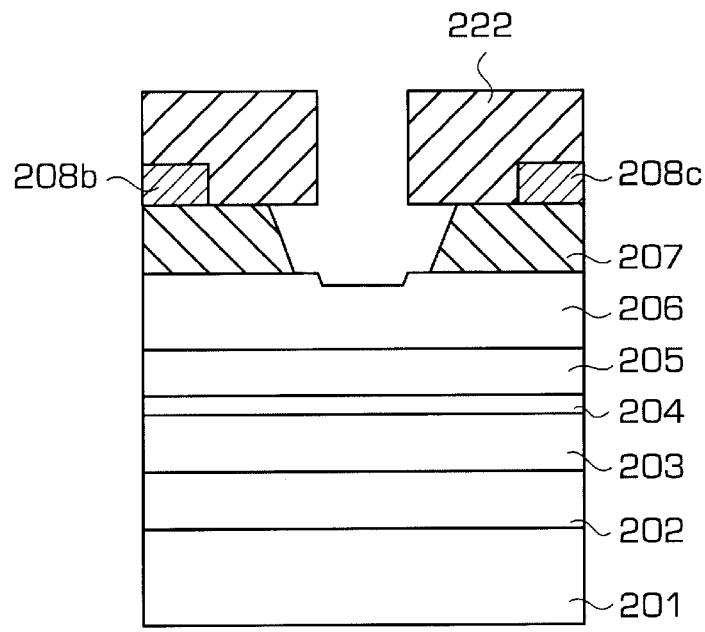
Figure 22:
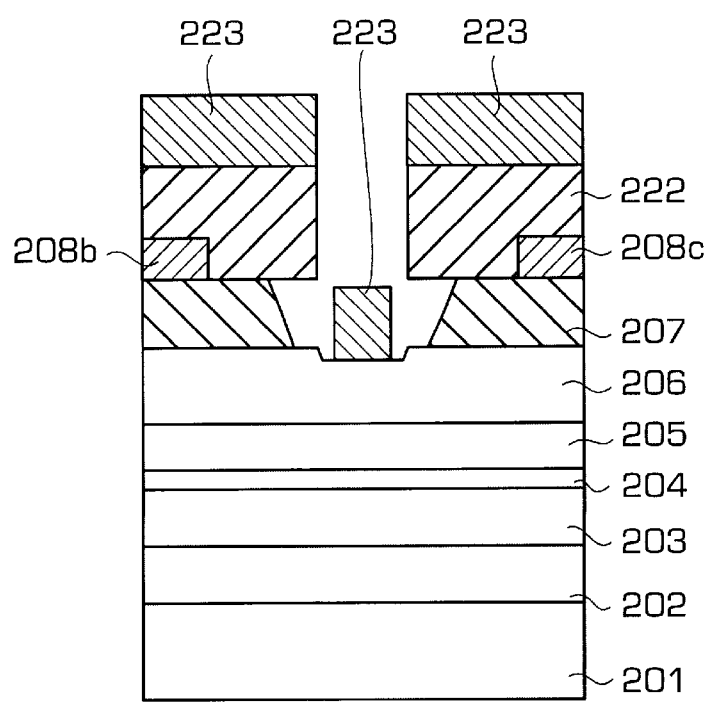
Figure 23:
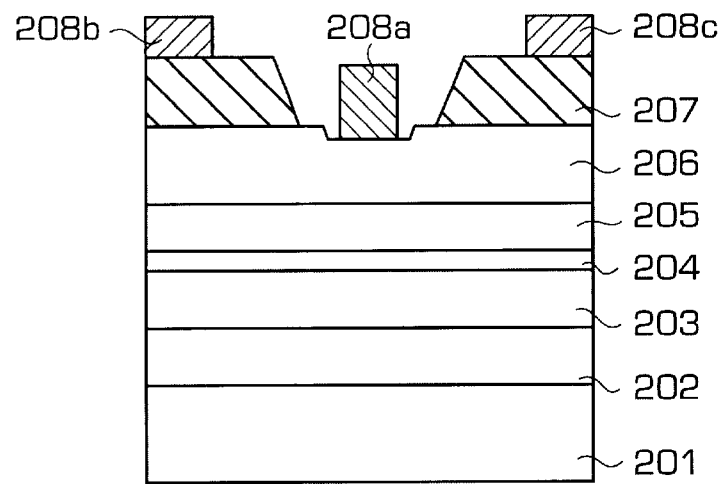
Figure 24:
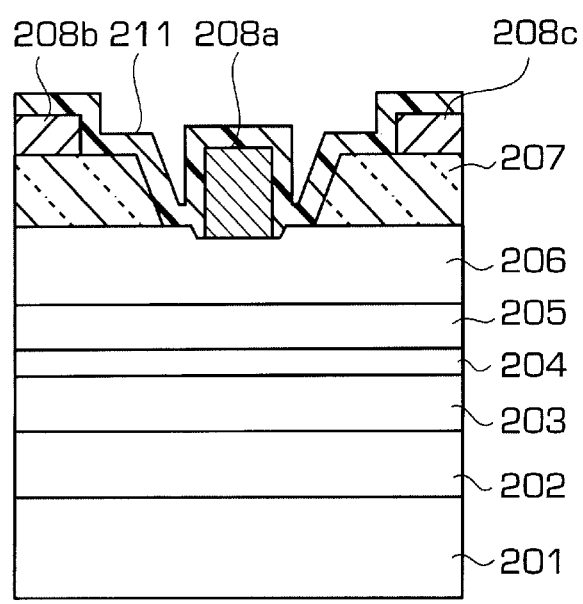
Figure 25:
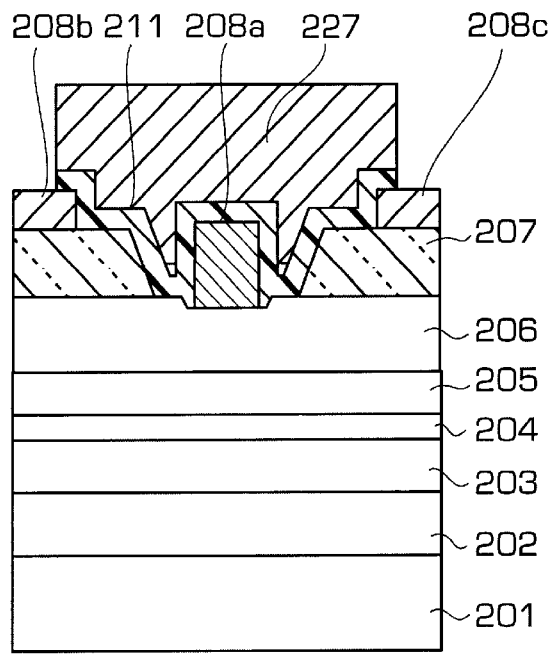

(g) Next, as shown in FIG. 21, using an etchant which can etch InGaAs selectively, a part of a doped InGaAs cap layer 207, exposed to the sidewall of the opening of the second recess which is formed in a step of (f), is selectively side-etched. As for the etchant for this etching, the same etchant as described in the first embodiment can be used. In this example, the sideetching is carried out till the width of the first recess becomes 2 $\mu$m.

Figure 26:
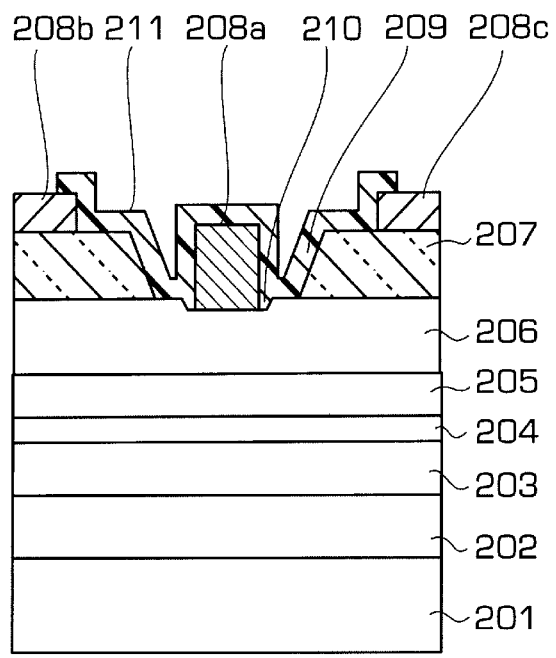

(h)~(l) Next, as shown in FIGS. 22-26, in the same manner as in the first embodiment, (h) after gate electrode metal 223 is deposited (FIG. 22), (i) the photoresist 222 is lifted off and a gate electrode 208a is formed (FIG. 23), and (j) a SiN passivation film 211 is grown on the surface (FIG. 24), and, (k) using a photoresist 227, the parts of the SiN passivation film 211 for external contacts of ohmic electrodes are removed (FIG. 25), and (l) finally, the photoresist 227 is removed and thereby an FET of FIG. 26 is completed.

In the FET manufactured in this way, AuGe, Ni and Au of ohmic electrodes 208b and 208c are alloyed with heat treatment and the alloy layer reaches to the surface of the undoped InGaAs channel layer 203. The depth of the finished first recess 209 reaches to the surface of the undoped InAlAs Schottky layer 206 and the width thereof is 2 $\mu$m. The depth of the second recess 210 which is formed within the first recess 209 reaches to the interior of the undoped InAlAs Schottky layer 206 and the width thereof is 1.1 $\mu$m.

As for the initial characteristics of this particular FET, the transconductance is 500 mS/mm, the Schottky barrier height is 0.5 eV and the gate inverse breakdown voltage is 10 V. Although this embodiment of FET is inferior to the first embodiment, with respect to the initial characteristics of the transconductance and the gate inverse withstand voltage as shown above, the width of the first recess is formed with excellent controllability, using the present manufacturing method so that no big kink is found and, moreover, stable characteristics of the device without optical responses are obtained.

In fabrication of a two-stage recess in the conventional manufacturing methods, steps of recess formation and gate formation are required for respective stages, that is twice each. This makes manufacturing process rather complicated. As against that, in the manufacturing methods of these embodiments, steps of exposure using photoresist, developing and etching are performed only once for two stages, which simplifies manufacturing process and makes cost reduction possible.

Further, although the above embodiments are described quoting specific materials and specific values, it is not necessary for the thickness of each layer and the doping density and the like to have the same value as shown here. Furthermore, it is also possible to use a structure in which planar doping of Si and the like to an InAlAs electron supply layer is performed. Besides, Si is used in these embodiments as doping impurities but, in addition to Si, any other materials, capable to carry out n-type doping, such as sulphur and selenium, may be used.

Further, in the present invention, "undoped" means either that impurities are not added intentionally to a semiconductor, or that impurities are added to a semiconductor but at a sufficiently low concentrations, normally $1 \times 10^{16}$ cm$^{-3}$ or less.

Further, with respect to materials forming the gate electrode through which the electric field is applied, in addition to the Ti/Pt/Au layered structure, Mo/Ti/Pt/Au layered structure, WSi, W, Ti/Al layered structure, Pt/Ti/Pt,/Au layered structure, or a single layer or multilayers of various metals such as Al may be used.

As for ohmic electrode materials, Ti/Pt/Au are used as non-alloy ohmic electrode materials in the first embodiment, while AuGe/Ni are used as annealed alloy-type ohmic electrode materials in the second embodiment, but in application of the manufacturing method of the present invention, either alloy type or non-alloy type ohmic electrodes can be used. For non-alloy type ohmic electrodes, in addition to the Ti/Pt/Au layered structure, the afore-mentioned electrode materials which are normally used for the gate electrode may be used.

According to the present invention, there can be provided an FET, having a two-stage recess structure formed upon an InP substrate and showing stable device characteristics, and particularly a stable FET with a low contact resistance. That is, in the FET of the present invention, since the most part of the InAlAs surface neighboring the gate side is placed at higher positions than the gate-semiconductor contact position, the unstability of the InAlAs surface does not affect the device operation. Besides, surface layers thereof are doped to become n-type so that a non-alloy ohmic contact also provides a low contact resistance and thereby the source resistance cannot be degraded severely. Therefore, the FET of the present invention can be used as a device with high performance and high reliability in the microwave and milimeter-wave region.

Further, according to the manufacturing method of the present invention, it is possible to manufacture such a high performance two-stage recess-type FET with excellent controllability. Further, the n-type InGaAs second cap layer which is the outermost surface layer, is etched selectively after the surface for gate contact is exposed, and whereby the width of the first recess is determined. Hence, first recess opening can be formed with excellent controllability and, simultaneously, steps of manufacturing process are simplified and the manufacturing cost is reduced.

Further, manufacturing method of the present invention can be applied even to the conventional device structures in which an n-type InAlAs layer is not utilized as a part of the cap layers right under the outermost surface layer of InGaAs.

What is claimed is:

1. A field effect transistor, comprising, upon an InP substrate:

a channel layer formed from an undoped semiconductor, an electron supply layer in which n-type impurities are doped partially or all along the direction of the thickness, for supplying carriers to said channel layer, an undoped InAlAs Schottky layer, an n-type InAlAs first cap layer set in contact with said Schottky layer, an n-type InGaAs second cap layer set in contact with said first cap layer, a first recess opening bored through said second cap layer to the upper surface of said first cap layer, the upper surface of said first cap layer defining the bottom of said first recess opening, a second recess opening which is bored, within the first recess opening, through said first cap layer to the upper surface of said Schottky layer or to the interior of said Schottky layer by removing a part thereof, wherein the width of the top of said second recess opening is smaller than the width of the bottom of said first recess opening, a gate electrode formed on the exposed surface of said Schottky layer at the bottom of the second recess opening, and a source electrode and a drain electrode which are formed upon said second cap layer on each side of said first recess opening.

2. A field effect transistor according to claim 1, wherein said channel layer is an undoped InGaAs layer and said electron supply layer is an InAl as layer including at least one n-type layer.

3. A field effect transistor according to claim 2, having an undoped InAlAs buffer layer between said InP substrate and channel layer.

* * * * *

UNITED STATES PATENT AND TRADEMARK OFFICE
CERTIFICATE OF CORRECTION

PATENT NO. : 6,194,747 B1　　　　　　　　　　　　　　　　　　　　　　Page 1 of 1
DATED     : February 27, 2001
INVENTOR(S) : Kazuhiko Onda It is certified that error appears in the above-identified patent and that said Letters Patent is hereby corrected as shown below:

Title page,
In the title after "TRANSITSTOR" insert -- AND METHOD OF MANUFACTURING THEREOF --

Column 1,
Line 46, delete "$Al_{0.45}$" insert -- $Al_{0.48}$ --;
Line 66, delete "being"

Column 12, 24
Delete "InAl as" insert -- InAlAs --

Signed and Sealed this

Twenty-fifth Day of December, 2001

Attest:

Attesting Officer

JAMES E. ROGAN
Director of the United States Patent and Trademark Office